(12) United States Patent
Jutsen

(10) Patent No.: US 7,613,624 B2
(45) Date of Patent: *Nov. 3, 2009

(54) COMPUTERIZED MANAGEMENT SYSTEM AND METHOD FOR MAINTENANCE PERFORMANCE EVALUATION AND IMPROVEMENT

(75) Inventor: Jonathan Jutsen, Sydney (AU)

(73) Assignee: Energetics Pty Ltd, North Sydney (AU)

( * ) Notice: Subject to any disclaimer, the term of this patent is extended or adjusted under 35 U.S.C. 154(b) by 1020 days.

This patent is subject to a terminal disclaimer.

(21) Appl. No.: 10/791,563

(22) Filed: Mar. 2, 2004

(65) Prior Publication Data

US 2004/0167810 A1   Aug. 26, 2004

Related U.S. Application Data

(63) Continuation-in-part of application No. 09/376,443, filed on Aug. 18, 1999, now Pat. No. 6,701,298.

(51) Int. Cl.
 *G06Q 10/00* (2006.01)
(52) U.S. Cl. ............................................. 705/7; 705/1
(58) Field of Classification Search ....................... 705/7
 See application file for complete search history.

(56) References Cited

U.S. PATENT DOCUMENTS

| | | | |
|---|---|---|---|
| 4,979,122 A | 12/1990 | Davis et al. | |
| 4,990,893 A | 2/1991 | Kiluk | |
| 5,001,630 A | 3/1991 | Wiltfong | |
| 5,216,623 A | 6/1993 | Barrett et al. | |
| 5,237,507 A | 8/1993 | Chasek | |
| 5,347,466 A | 9/1994 | Nichols et al. | |
| 5,467,265 A | 11/1995 | Yamada et al. | |
| 5,487,002 A | 1/1996 | Diller et al. | |
| 5,717,609 A | 2/1998 | Packa et al. | |
| 5,745,114 A | 4/1998 | King et al. | |
| 5,758,331 A | 5/1998 | Johnson | |
| 5,794,212 A | 8/1998 | Mistr, Jr. | |
| 5,873,251 A | 2/1999 | Iino | |
| 5,963,457 A | 10/1999 | Kanoi et al. | |
| 6,029,092 A | 2/2000 | Stein | |
| 6,088,688 A | 7/2000 | Crooks et al. | |
| 6,122,603 A | 9/2000 | Budike, Jr. | |
| 6,178,362 B1 | 1/2001 | Woolard et al. | |
| 6,269,624 B1 | 8/2001 | Frutschi et al. | |

OTHER PUBLICATIONS

Basim Al-Najjar, Total Quality Maintenance: An Approach for Continuous Reduction in Costs of Quality Products, Journal of Quality in Maintenance Engineering, v2n3, pp:4-20, 1996.*

A. Raouf, M. Ben-Daya, Total Maintenance Management: A Systematic Approach, Journal of Quality in Maintenance Engineering, v01n1, pp. 6-14, 1995.*

* cited by examiner

*Primary Examiner*—Andre Boyce
(74) *Attorney, Agent, or Firm*—Pauley Peterson & Erickson

(57) ABSTRACT

A system and method for maintenance management in which data relating to maintenance usage and maintenance-related policies and practices is collected in an automated data processing device. The data is analyzed to arrive at a diagnosis of maintenance management effectiveness from which recommendations for improving the maintenance management effectiveness are generated.

12 Claims, 2 Drawing Sheets

Overall Process

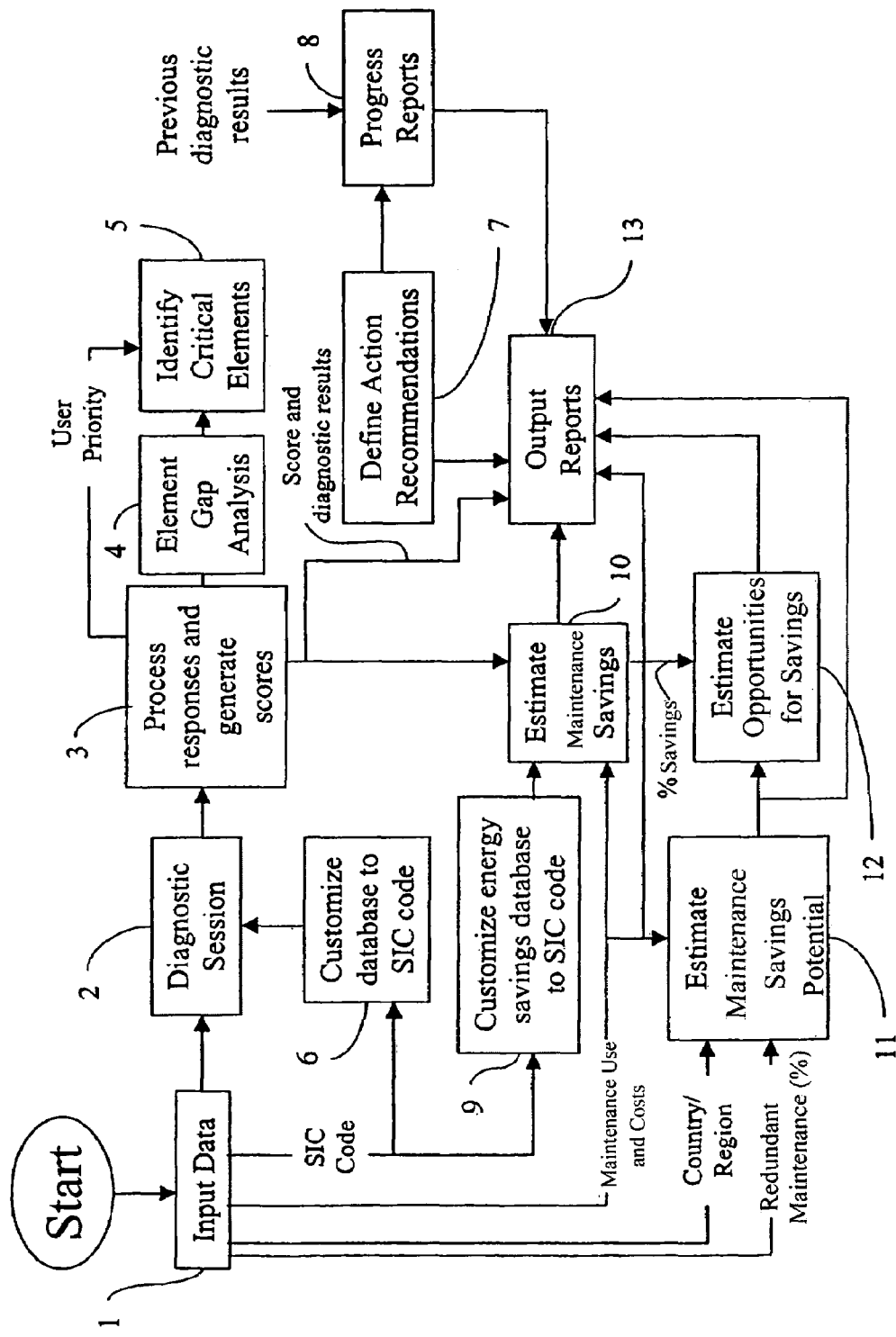
Figure 1 Overall Process

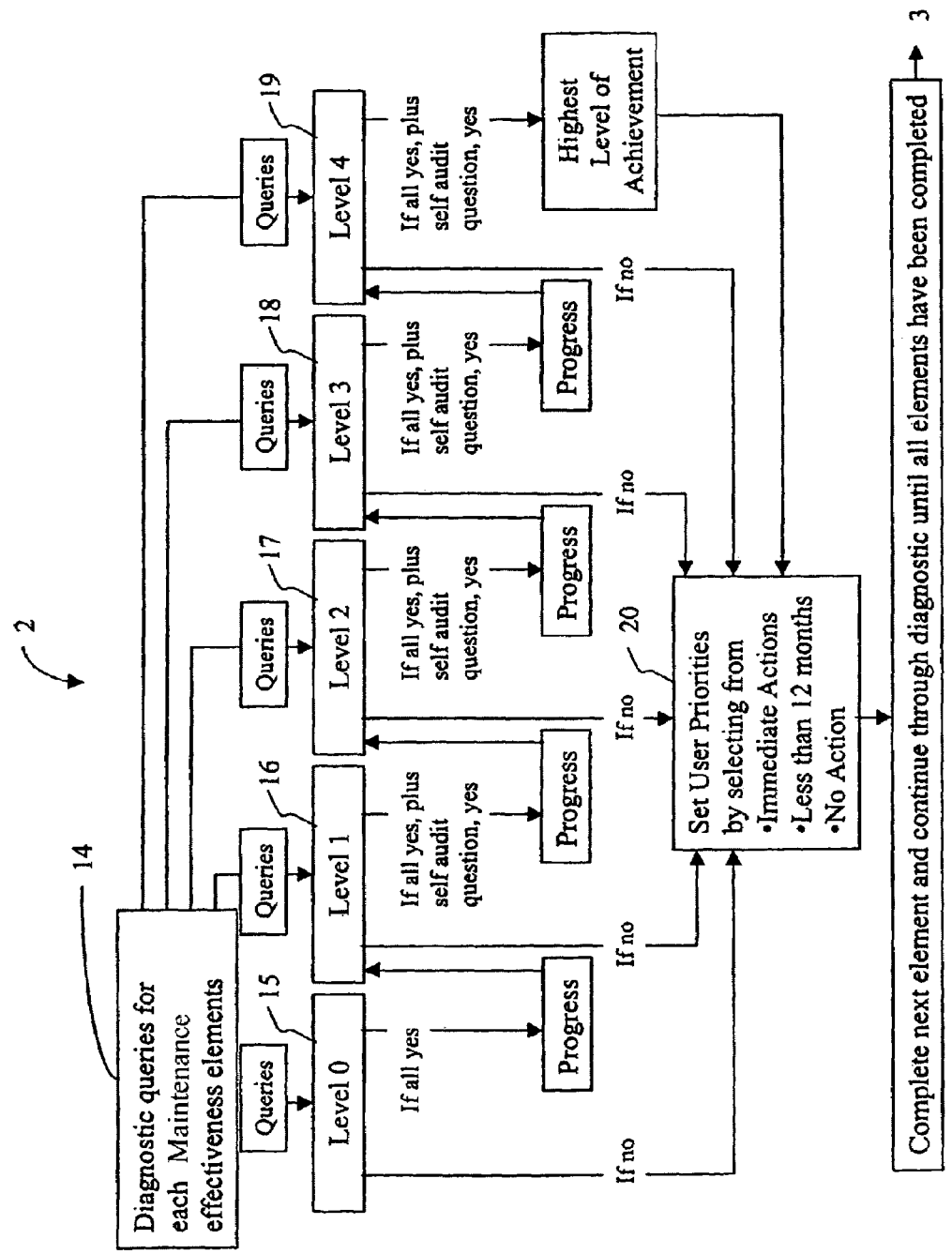
Figure 2. Diagnostic Session

COMPUTERIZED MANAGEMENT SYSTEM AND METHOD FOR MAINTENANCE PERFORMANCE EVALUATION AND IMPROVEMENT

CROSS REFERENCE TO RELATED APPLICATIONS

This application is a continuation-in-part of application Ser. No. 09/376,443, filed on 18 Aug. 1999, which issued as U.S. Pat. No. 6,701,298 on 02 Mar. 2004.

BACKGROUND OF THE INVENTION

1. Field of the Invention

This invention relates to a computerized method for establishing systems for managing the maintenance operations and procedures of an organization. It is particularly directed toward larger organizations, be they corporate (industrial/commercial) or government/institutional for whom, controlling maintenance costs is generally done poorly or in a nonsystematic, haphazard or uncoordinated fashion, due to lack of formal management systems. The method and system of this invention facilitate development of strategies for reducing maintenance costs and monitoring progress made on an ongoing basis toward the fulfillment of strategy objectives and, ultimately, a reduction in maintenance costs. All of this is achieved independently of any physical system by which the utilization of maintenance is controlled.

2. Description of Prior Art

Conventional maintenance management, particularly in commercial, corporate and industrial settings, is a technical process, often carried out by systems and methods which directly control maintenance costs. Such maintenance management systems frequently involve measurement of one or more parameters associated with maintenance.

The major problem with prior art is that the approach generally taken for maintenance cost control up to this invention does not impact on management systems and practices of the user. Nor does it integrate with other improvement programs that may be undertaken by the user. Prior to this invention, there has been no way to quantify the effectiveness of management processes for maintenance cost control and as a result there was no process possible for benchmarking maintenance management practices. As a result, it was difficult for operations to know how well they were performing.

SUMMARY OF THE INVENTION

Accordingly, it is one object of this invention to provide a method and system for maintenance management which is dynamic and, thus, provides the potential for continuously improving maintenance utilization efficiency up to an optimum efficiency level.

It is another object of this invention to provide a method and system for maintenance management which functions independently of any maintenance usage monitoring and control equipment or in any reporting systems or technologies already in place.

It is yet another object of this invention to provide a computerized method for establishing management systems for use by operations requiring maintenance.

These and other objects of this invention are achieved by a computerized method for maintenance management comprising the steps of collecting data relating to maintenance usage and maintenance-related policies and practices in an automated data processing device, analyzing the data to derive a diagnosis of maintenance management effectiveness based upon analysis of a plurality of effectiveness elements, determining the relative priority for taking action for each of the effectiveness elements analyzed and determining critical elements for action, generating recommendations for improving maintenance management effectiveness in each critical element, and benchmarking the result against those of other operations.

Diagnosis of maintenance management effectiveness in accordance with the method of this invention involves consideration of a plurality of effectiveness elements and a level of achievement made in each of the effectiveness elements. Thus, the diagnosis includes an indication of progress achieved with respect to each effectiveness element which, in turn, translates into a determination of actual performance with respect to goals set for each effectiveness element. The diagnosis also defines critical actions to be taken first in order to best effectuate the desired maintenance utilization objectives. It does this through a novel analysis process, which considers the gap between current practice and best practice in each element, and the priority level set by the user of the software. Information provided by the diagnosis can then be formulated into a series of reports by which the management of an organization can develop strategies, maintenance-related policies and practices for improving maintenance utilization efficiency. The diagnostic results can then be automatically benchmarked against other organizations on a web-site benchmarking database.

BRIEF DESCRIPTION OF THE DRAWINGS

These and other objects and features of this invention will be better understood from the following detailed description taken in conjunction with the drawings wherein:

FIG. 1 is a general flow diagram for the method of this invention; and

FIG. 2 is a detail of the diagnosis portion or session of the method of this invention.

DESCRIPTION OF PREFERRED EMBODIMENTS

Disclosed herein is a management system for maintenance which, in addition to providing direction to improve maintenance utilization efficiency, also monitors the extent of achievement made towards reaching established maintenance efficiency goals. The method of this invention comprises four basic elements—data input 1 relating to maintenance usage and maintenance-related policies and practices into an automated data processing device, derivation of a diagnosis of maintenance management effectiveness 2, the definition of critical actions for action 5 and generation of recommendations for improving maintenance management effectiveness 8. In accordance with one embodiment of this invention, results are benchmarked through an automatic 'hot-link' to a web-site database. In addition to providing an indication of the broad range of potential maintenance savings which can be achieved by improving the diagnostic maintenance score from its existing level to the best practice level, the method of this invention includes a further benefit, namely an estimate of a reduction in maintenance costs which is potentially achievable by improving the diagnostic maintenance score from its existing level to the best practice level.

The initial step in accordance with the method of this invention, as shown in FIG. 1, is the collection of data 1 relating to maintenance usage and maintenance-related policies and practices and inputting said data into an automated data processing device. The data to be input into the data processing device is broken down into at least two categories—business data, that is information regarding the organization employing the method of this invention, and maintenance use data for such organization. Business data, which is only entered into the data processing device once, in addition to identification of the organization, also includes a categorization of the organization based upon industry type in accordance with, for example, standard industrial classification (SIC) codes. The software selects a customized question database 6 for the diagnostic based on the industry type selected. The type of industry in which the organization is engaged is important as a measure against which the progress of the organization with respect to maintenance utilization efficiency can be assessed (benchmarking).

The second set of data for input into the data processing device is maintenance use data, which is used in the quantification of an organization's maintenance savings potential 11. In addition, it also contributes to the identification of opportunities for maintenance reductions 12. The maintenance use data collected includes maintenance sources, for example equipment, facilities and/or vehicles, the annual labor hours for each type of maintenance and the annual cost for each type of maintenance. As conditions change, the "input report" may be modified to reflect the changes.

The next step in the method of this invention is the analysis of the data to arrive at a diagnosis of maintenance management effectiveness. For details of the diagnostic procedure, see FIG. 2. Data analysis (diagnostic) involves consideration of a plurality of elements of effective maintenance management 14, each of which elements is considered on the basis of responses by a user to queries regarding each of the elements. The queries 15, presented in simple statement form, are typically statements of organizational attitude towards maintenance management and activities and practices related to the management of maintenance use. In each case, the user provides a response indicative of the level of progress made by the organization towards implementation of each of the queried actions. There are a defined set of queried actions corresponding to each level of progress 16, 17, 18, 19 and 20 towards achievement of each effective element to which the queries relate. At the outset, for each element, the initial level of achievement is the lowest level 16. The user may progress through to higher levels of achievement for each effectiveness element to the highest level 20 based upon positive user responses to the queries for each effective element, providing the user is also able to verify achievement of the requirements of a qualifying question ('self-audit' or 'challenger' question) which tests a practical example relating to the general statements at that level of progress. Thus, to move from Level 0 (16) to Level 1 (17), a user must respond in the affirmative to each of the queries for each effectiveness element for Level 0 (16). To move from Level 1 (17) to Level 2 (18), in addition to affirmatively responding to each of the queries, the user must also conduct a self-audit for verifying the achievement of the requirements thereof and, thus, confirm responses given to the queries. If the user is unable to respond affirmatively to all of the queries and verify the achievement of the requirements at any level of progress, the user does not move to the next level of progress, but rather is given the opportunity to set priorities 21 for actions to be taken to enable movement to the next level of progress. Such priorities include immediate action, action in less than 12 months and no action, as shown in FIG. 2. Responses to the queries for each effectiveness element are stored 3, thereby enabling a user to compare current levels of achievement to previous levels of achievement for a given effectiveness element 9. Upon completion of query responses for each effectiveness element 9, the effectiveness elements are subjected to a priority ranking 5. This ranking, to define 'critical' elements 5, is done utilizing an element gap analysis 4 (the higher priority being accorded to elements in which the gap between current practice and 'best' practice 19 is the largest), combined with a user priority setting defined for each effectiveness element by the user.

Upon completion of the data analysis, a diagnosis is derived for each of the effectiveness elements, which defines the level of development or achievement by the user with respect to each of the effectiveness elements, the priority given by the user to achievement of each of the effectiveness elements and an indication of effectiveness elements for which critical action 8 is required.

Examples of effectiveness elements include such things as "demonstrated corporate commitment," "planning processes," "awareness and training," "maintenance operating budgets," "operating procedures," "maintenance procedures," processes for auditing progress and the like.

As a result of the diagnosis, recommendations regarding actions to be taken for improving maintenance management effectiveness are generated automatically for each of the critical elements. Based upon the overall level of development (score) gap analysis 7, in accordance with one embodiment, the method of this invention further comprises generating an estimate of potential maintenance savings 11 upon achievement of all of the effectiveness elements. In accordance with another embodiment, the method of this invention further comprises generating an estimate of potential maintenance cost reductions 13 which may be achieved upon implementation of each of the effectiveness elements.

The diagnosis and recommendations generated (output reports 14) in accordance with the method of this invention may be displayed by a variety of display means including, but not limited to, printed reports and display monitors.

In order to assess the level of achievement made by an organization regarding maintenance management effectiveness, the method of this invention is periodically repeated and the results compared to previous results obtained and this generates progress reports 9.

It is also possible for the user to automatically be transferred by the software to a purpose developed web-site for benchmarking against other users that have submitted their results to the database, within their company or in their broader industry grouping.

The method of this invention is carried out by a system comprising means for collecting and storing data relating to maintenance usage and maintenance-related policies and practices, means for deriving a diagnosis of maintenance management effectiveness using the collected and stored data, and means for deriving recommendations for improving the maintenance management effectiveness. The diagnosis derived in accordance with the method of this invention comprises a plurality of effectiveness elements and a level of development for each of the effectiveness elements. In accordance with one embodiment of this invention, the management system comprises means for generating an estimate of potential maintenance savings. The system of this invention also comprises means for estimating a potential maintenance savings which may be achieved upon reaching the highest level of achievement for each of the effectiveness elements.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

We claim:

1. A computerized method for diagnosing and defining actions for improvement in maintenance management comprising the steps of:
   collecting data relating to maintenance usage and maintenance-related policies and practices in an automated data processing device;
   using a defined set of characteristics, in the automated data processing device, for each of a plurality of levels of achievement to derive a diagnosis of maintenance management effectiveness, said diagnosis comprising a plurality of effectiveness elements and a level of achievement for each said effectiveness element and allowing quantification of a status of maintenance management practices;
   determining a relative priority for taking action for each of said effectiveness elements using an element gap analysis wherein a higher priority is accorded to those effectiveness elements in which a gap between a current practice and a best practice is the largest;
   determining at least one critical element for action based upon the relative priority for taking action; and
   automatically generating recommendations, from the automated data processing device, for improving said maintenance management effectiveness for each of said critical elements.

2. A method in accordance with claim 1 further comprising benchmarking at least one result of the method against comparable user operations.

3. A method in accordance with claim 1 further comprising generating an estimate of potential maintenance savings.

4. A method in accordance with claim 1, wherein said diagnosis and said recommendations are output to a display means.

5. A method in accordance with claim 4, wherein said display means is selected from the group consisting of a display monitor, a printer, an e-mail file and combinations thereof.

6. A method in accordance with claim 1, wherein each of said steps is repeated over time to derive an assessment of overall improvements in maintenance management effectiveness with time.

7. A computerized method for diagnosing and defining actions for improvement in maintenance management comprising the steps of:
   collecting data relating to maintenance usage and maintenance-related policies and practices in an automated data processing device;
   using a defined set of characteristics, in the automated data processing device, for each of a plurality of levels of achievement to derive a diagnosis of maintenance management effectiveness, said diagnosis comprising a plurality of effectiveness elements and a level of achievement for each said effectiveness element and allowing quantification of a status of maintenance management practices;
   determining a relative priority for taking action for each of said effectiveness elements using an element gap analysis, wherein a higher priority is accorded to those effectiveness elements in which a gap between a current practice and a best practice is the largest thereby defining at least one critical element;
   determining at least one critical element for action;
   automatically generating recommendations, from the automated data processing device, for improving said maintenance management effectiveness for each of said critical elements;
   benchmarking at least one result of the method against comparable user operations; and
   determining a level of progress for each of said plurality of effectiveness elements.

8. A method in accordance with claim 7, wherein each of said steps is repeated over time to derive an assessment of overall improvements in maintenance management effectiveness with time.

9. A computerized method for diagnosing maintenance management effectiveness and defining actions for improvement in maintenance management comprising the steps of:
   collecting data relating to maintenance usage and maintenance-related policies and practices in an automated data processing device;
   presenting a set of queried actions, in the automated data processing device, for each of a plurality of levels of achievement for each of a plurality of effectiveness elements;
   using responses to the set of queried actions for each effectiveness element to prioritize the plurality of effectiveness elements to define at least one critical element, wherein the prioritization comprises an element gap analysis of each effectiveness element so that a higher priority is accorded to those effectiveness elements in which a gap between a current practice and a best practice is the largest;
   diagnosing a maintenance management effectiveness for each effectiveness element wherein the level of achievement is defined by a user with respect to each effectiveness element, the user providing a priority to achievement of each effectiveness element;
   providing an indication of effectiveness elements for which critical action is required; and
   automatically generating recommendations, from the automated data processing device, for each effectiveness element regarding critical action to be taken for improving maintenance management.

10. A method in accordance with claim 9 further comprising generating an estimate of potential maintenance savings upon achievement of the plurality of effectiveness elements.

11. A method in accordance with claim 9 wherein the method is periodically repeated to compare newly obtained results with previous results to generate a progress report.

12. A method in accordance with claim 11 wherein the element gap analysis for each effectiveness element comprises a determination of a gap between a current practice and a best practice for the effectiveness element.

* * * * *